(12) United States Patent
Liu

(10) Patent No.: US 7,265,057 B2
(45) Date of Patent: Sep. 4, 2007

(54) 3D LITHOGRAPHY WITH LASER BEAM WRITER FOR MAKING HYBRID SURFACES

(75) Inventor: Xinbing Liu, Acton, MA (US)

(73) Assignee: Matsushita Electric Industrial Co., Ltd, Osaka (JP)

(*) Notice: Subject to any disclaimer, the term of this patent is extended or adjusted under 35 U.S.C. 154(b) by 0 days.

(21) Appl. No.: 11/282,884

(22) Filed: Nov. 18, 2005

(65) Prior Publication Data
US 2007/0175860 A1    Aug. 2, 2007

(51) Int. Cl.
*H01L 21/302* (2006.01)
(52) U.S. Cl. ........................ 438/725; 216/67
(58) Field of Classification Search ............ 438/706, 438/710, 712, 714, 725; 216/58, 67
See application file for complete search history.

(56) References Cited

U.S. PATENT DOCUMENTS

| | | | |
|---|---|---|---|
| 6,545,807 B2 | 4/2003 | Maruyama | |
| 6,562,523 B1* | 5/2003 | Wu et al. | 430/5 |
| 2003/0022070 A1* | 1/2003 | Lee et al. | 430/5 |
| 2004/0130785 A1 | 7/2004 | Yun et al. | |
| 2004/0146807 A1* | 7/2004 | Lee et al. | 430/311 |
| 2004/0165165 A1* | 8/2004 | Yun et al. | 355/53 |
| 2005/0053844 A1* | 3/2005 | Wu | 430/5 |

OTHER PUBLICATIONS

Wolf et al. "Silicon Processing for the VLSI Era", vol. 1, 1986, lattice Press, p. 431.*
"Diffractive Optics: Design, Fabrication, and Test", by Donald C. O'Shea et al., Publication date: Dec. 2003, Chapter 5, Design of Diffraction Gratings, (pp. 83-85); Chapter 6, Making A Diffractive Optical Element, (pp. 115-118); Chapter 7, "Photolithographic Fabrication of Diffractive Optical Elements", (pp. 133-135).

* cited by examiner

*Primary Examiner*—Kin-Chan Chen
(74) *Attorney, Agent, or Firm*—RatnerPrestia

(57) ABSTRACT

A method of etching a feature in a surface of a substrate. The substrate is provided. A photoresist layer is formed on the surface of the substrate. A thickness profile of the formed photoresist layer is determined. A grayscale scanning pattern is determined based on the feature and the thickness profile of the photoresist layer. The determined grayscale scanning pattern is laser written on the photoresist layer to expose a portion of the photoresist layer. The exposed portion of the photoresist layer is removed to form a grayscale pattern in the photoresist layer. The photoresist layer and the surface of the substrate are etched to form the feature in the surface of the substrate.

20 Claims, 7 Drawing Sheets

US 7,265,057 B2

3D LITHOGRAPHY WITH LASER BEAM WRITER FOR MAKING HYBRID SURFACES

FIELD OF THE INVENTION

The invention relates to methods of lithography using a laser beam writer to produce features in a substrate and, more particularly, to a method of producing desired three dimensional features in a substrate.

BACKGROUND OF THE INVENTION

Direct e-beam (electron-beam) milling has been used conventionally to produce grayscale features in a substrate by directing an electron beam towards the substrate in a scanning pattern and either modulating the intensity of the electron beam or the scan rate across the substrate such that a grayscale pattern is produced in the substrate as grayscale features. However, direct e-beam writing is both slow and costly, and also the precision of the grayscale features (e.g., the height of each step of the grayscale features) is based on how precisely the scan rate and/or the intensity of the e-beam are set. The use of lower intensities and commensurately lower scan rates may improve the precision with which these parameters may be controlled, but at a cost in throughput.

Given these potential disadvantages of direct e-beam milling, an alternative method of producing precise grayscale features in a substrate with a reduced time to completion and a reduced cost may be desirable. Improved precision in the height of these grayscale features (e.g., the overall height and the height of each step) may also be desirable. Three dimensional (grayscale) lithography may offer such an alternative approach to forming grayscale features. The present invention involves the use of a laser beam writer for grayscale lithographic applications.

SUMMARY OF THE INVENTION

An exemplary embodiment of the present invention is a method of etching a feature in a surface of a substrate. A photoresist layer is formed on the surface of the substrate. A thickness profile of the formed photoresist layer is determined. A grayscale scanning pattern is determined based on the feature and the thickness profile of the photoresist layer. The determined grayscale scanning pattern is laser written on the photoresist layer to expose a portion of the photoresist layer. The exposed portion is removed to form a grayscale pattern in the photoresist layer. This patterned photoresist layer and the surface of the substrate are etched to form the feature in the surface of the substrate.

Another exemplary embodiment of the present invention is a method of etching a feature in a mold surface of a mold part. A photoresist layer is formed on the mold surface of the mold part. A thickness profile of the formed photoresist layer is determined. A grayscale scanning pattern is determined based on the feature and the thickness profile of the photoresist layer. The determined grayscale scanning pattern is laser written on the photoresist layer to expose a portion of the photoresist layer. The exposed portion is removed to form a grayscale pattern in the photoresist layer. This patterned photoresist layer and the mold surface of the mold part are etched to form the feature in the mold surface of the mold part. A release layer is formed on at least a portion of the mold surface of the mold part to reduce adherence by a mold product to the mold part during molding.

BRIEF DESCRIPTION OF THE DRAWINGS

The invention is best understood from the following detailed description when read in connection with the accompanying drawings. It is emphasized that, according to common practice, various features/elements of the drawings may not be drawn to scale. On the contrary, the dimensions of the various features/elements may be arbitrarily expanded or reduced for clarity. Moreover in the drawings, common numerical references are used to represent like features/elements. Included in the drawing are the following figures:

FIGS. 8B, 8C, and 8D are top plan views illustrating alternative exemplary embodiments of the exemplary mold shown in FIG. 8A, in which FIG. 8B shows an exemplary mold for a circular lens, FIG. 8C shows an exemplary mold for an elliptical lens, and FIG. 8D shows an exemplary mold for a cylindrical lens;

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Figure 1:
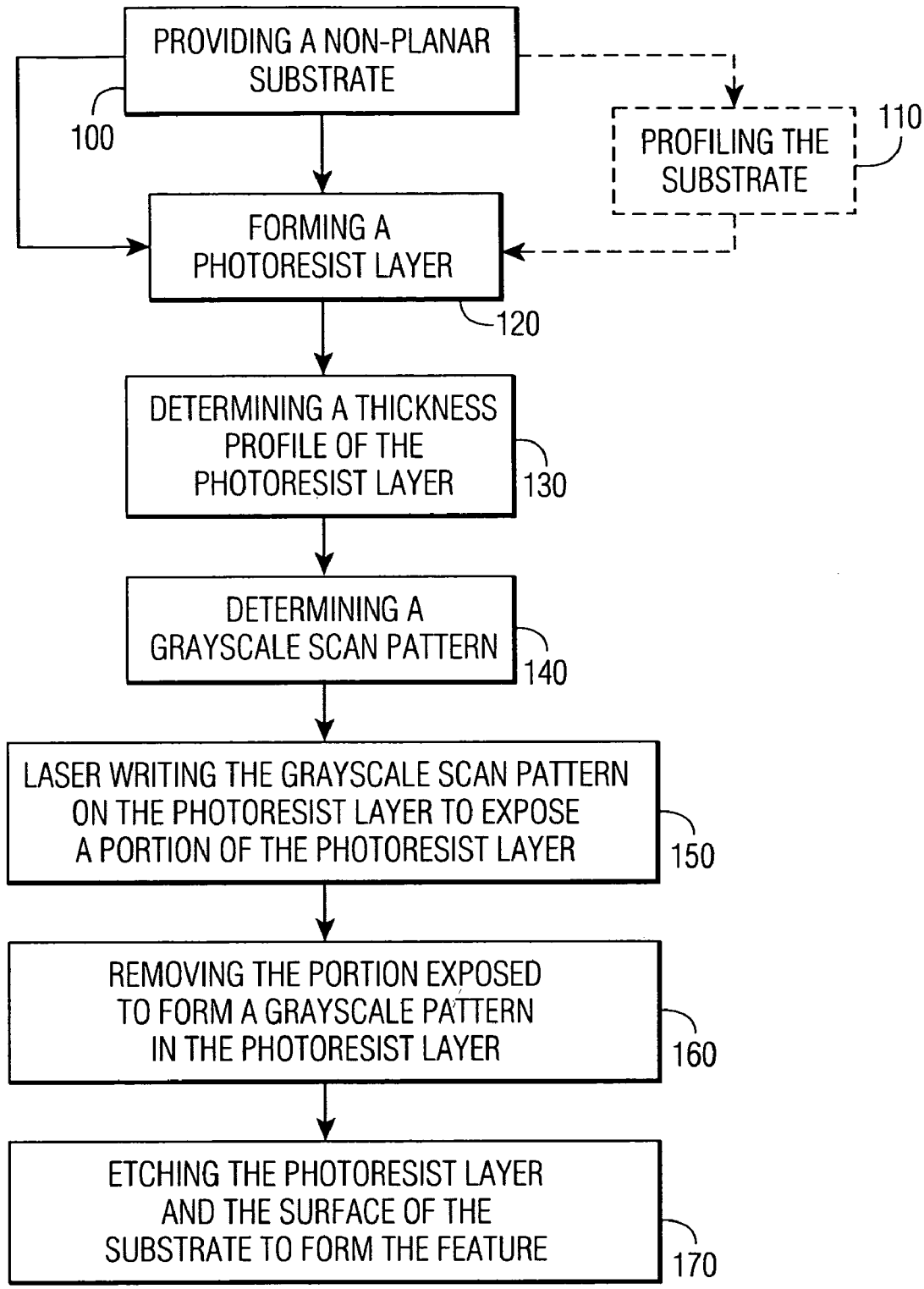
FIG. 1 is a flowchart illustrating a method of etching a feature on a surface of a substrate in accordance with an exemplary embodiment of the present invention.

FIG. 1 is a flowchart illustrating a method of etching a feature on a surface of a substrate in accordance with an exemplary embodiment of the present invention. FIGS. 2-7 are cross-sectional side views of an exemplary substrate illustrating the steps the exemplary method shown in FIG. 1.

Figure 2:
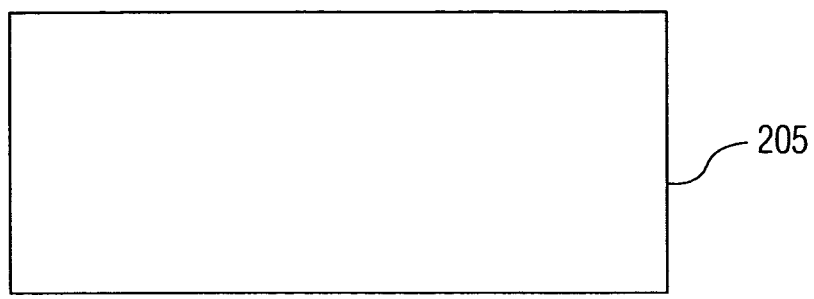
FIGS. 2, 3, 4, 5, 6, and 7 are cross-sectional side views of an exemplary substrate illustrating steps used in the exemplary method of FIG. 1.
Figure 3:
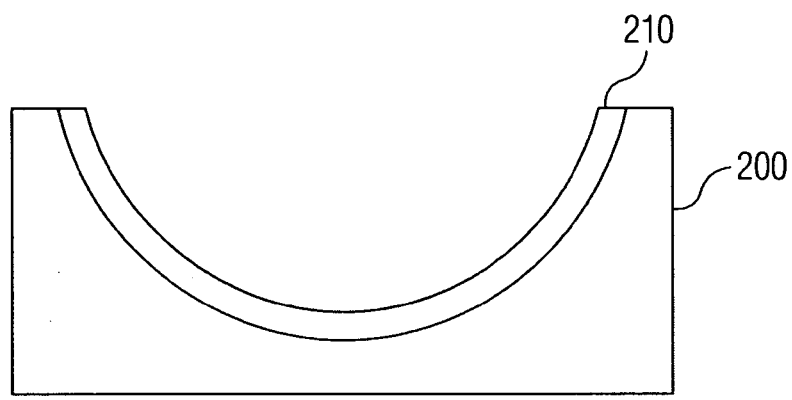
Figure 4:
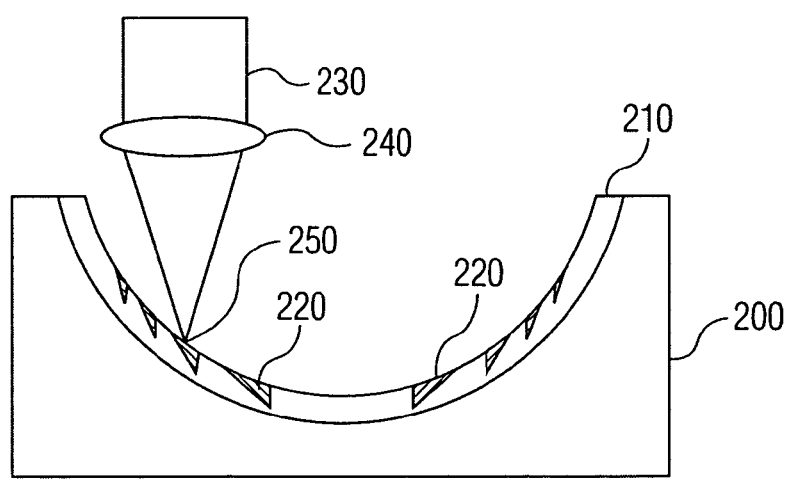
Figure 5:
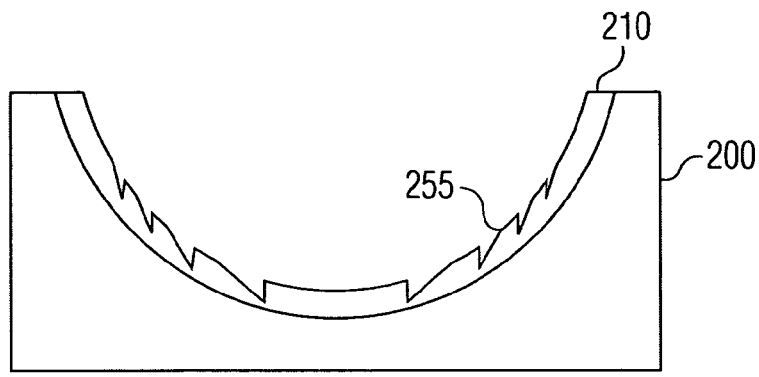
Figure 6:
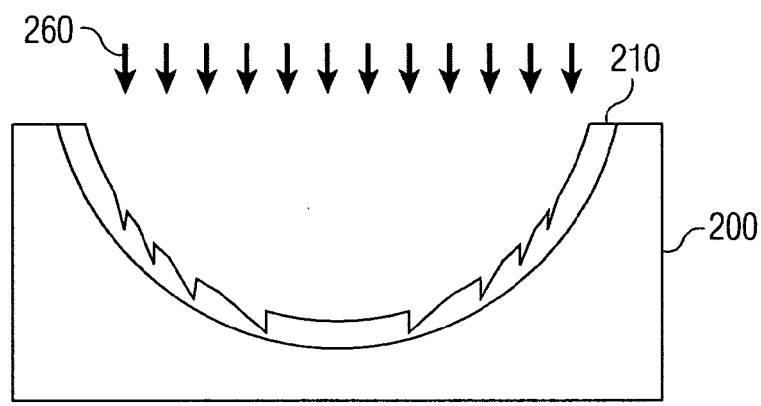
Figure 7:
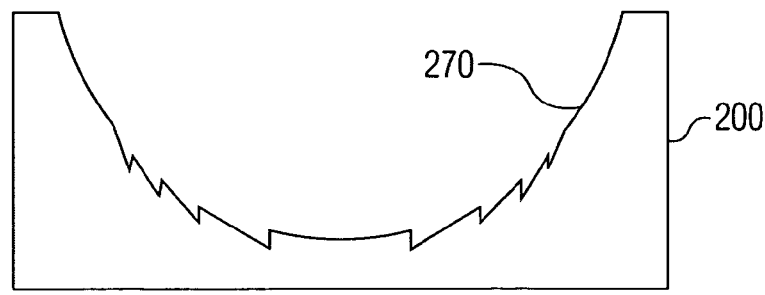

Referring now to FIGS. 2-7, in exemplary embodiments of the invention, a feature 270 of a non-planar substrate 200 (as shown in FIG. 7) may be realized, for example, by: (1) laser-writing a grayscale scanning pattern corresponding to feature 270 to be etched on the surface of substrate 200 on a photoresist layer 210 (as shown in FIG. 4) to expose a portion of photoresist layer 210; (2) removing the exposed portion of photoresist layer 210 to form grayscale pattern 255 (as shown in FIG. 5) in photoresist layer 210; and (3)

etching photoresist layer 210 and the surface of non-planar substrate 200 to form feature 270. That is, for example, a laser writing device (not shown) may laser-write grayscale scanning pattern 220 onto photoresist layer 210, and by removing the portion of photoresist layer 210 exposed by the laser writing device, and etching of photoresist layer 210 and the surface of non-planar substrate 200, desired feature 270 may be formed.

For illustrative purposes, an example of producing a first exemplary mold part for molding an optical device (e.g., a convex hybrid lens having a diffractive section) is described. However, this example is not intended to be limiting, it is contemplated that substrate 200 may be any number of other structures. For example, it may be: (1) a different type of mold for optical or non-optical use; (2) machined parts, such as pistons or other metal, ceramic, dielectric, or plastic mechanical structures; (3) deflective/reflective/spiral lenses; (4) lens with micro-arrays; (5) elliptical or cylindrical mirrors; (6) micro-electrical mechanic structure (MEMS) sensors and devices; (7) micro-machine devices or nano-machine devices; and/or other mechanical devices, among others. Furthermore, the method according to an exemplary embodiment of the invention may produce a hybrid lens directly.

In step 100, non-planar substrate 200 is provided. Non-planar substrate 200, shown in FIG. 3, may be formed by any number of materials, such as tungsten carbide, silicone carbide, sapphire, glass, ceramic, nickel, and/or stainless steel, among others. Non-planar substrate 200 refers to any substrate having a surface which is not planar or is not substantially planar (i.e., a surface having a three dimensional (3D) feature either therein or projecting therefrom). The 3D feature may be provided for only a portion of the surface of non-planar substrate 200 or may be provided for the entirety of the surface of non-planar substrate 200.

FIG. 2 illustrates an exemplary planar substrate 205, this exemplary substrate may be machined to form an exemplary non-planar substrate 200, using any machining standard technique, including molding, single point turning (with a diamond, sapphire, tungsten carbide, etc. tip), vibration assisted milling, milling with a diamond or other wheel, ion milling, laser ablation, and/or various etching techniques. It is noted that, alternatively, outward projecting features may grown on the surface of exemplary planar substrate 205 by conventional methods such as selective area growth to form an exemplary non-planar substrate 200.

At optional step 110, the surface of non-planar substrate 200 may be profiled by any number of profilometry techniques including, for example, by: (1) contact stylus profilometry techniques; (2) optical profilometry techniques; and/or (3) other non-contact profilometry techniques such as using an atomic force microscope or a scanning force microscope, among others.

Contact stylus profilometry techniques may include, for example, passing a stylus probe across the surface of non-planar substrate 200 and following its motion to produce a surface profile.

Optical profilometry techniques may use either a low coherent source or a coherent/monochromatic source, among others. Low coherent source techniques include, for example, white light interferometry, coherence radar, coherence scanning, correlation microscopy and/or interference microscopy. Coherent/monochromatic source techniques include, for example, laser profilometry, phase-shifting interferometry, speckle and holographic techniques, fringe projection and depth of focus methods, among others.

Profiling step 110 may be optional and if completed may enable a detection of abnormalities on the surface of non-planar substrate 200. This may allow grayscale scanning pattern 220 to be compensated for at step 140 based on the anomalies of the non-planar surface of substrate 200. Such compensation will be described below with reference to step 140.

A photoresist layer 210 may be formed on the surface of non-planar substrate 200, step 120 (as shown in FIG. 3). Photoresist layer 210 desirably may be positive photoresist, and may be formed from any number of known photoresist agents. Positive photoresist refers to a photoresist layer that, after having portions exposed, is developed (possibly using a chemically etch) to remove the exposed portions of the positive photoresist layer, while the unexposed portions of the photoresist layer remain.

Photoresist layer 210 may be formed by any number of coating techniques, including, for example, dip coating, film coating, spin coating, vapor deposition, and/or simply spreading the photoresist with a scalpel, etc., among others. Dip coating refers to dipping at least one portion of non-planar substrate 200 in a photoresist agent to form photoresist layer 210 by surface tension between the photoresist agent and non-planar substrate 200. Film coating refers to coating at least one portion of the surface of non-planar substrate 200 with a film which is made to adhere to the at least one portion of the surface of non-planar substrate 200. Spin coating refers to coating the at least one portion of the surface of non-planar substrate 200 with photoresist layer 210 by depositing photoresist agent at a desired location (e.g., approximately centered) on the surface of non-planar substrate 200 and spinning non-planar substrate 200 to cause the photoresist agent to spread (e.g., in a substantially uniform manner) across the at least one portion of the surface of non-planar substrate 200. Typically, vapor deposition refers to placing non-planar substrate 200 in a vacuum chamber and adding a gas (i.e., vapor) including the photoresist agent at low pressure which after a period of time deposits (accumulates) on non-planar substrate 200 as photoresist layer 210.

A thickness profile of photoresist layer 210 may be determined, step 130. The thickness profile refers to the thickness of photoresist layer 210 in a direction of light 230 incident on photoresist layer 210 for laser writing the grayscale scanning pattern 220 at step 150. The method of forming photoresist layer 210 may affect its uniformity. For example, applying a film to the surface or spreading the photoresist (e.g., spin-coating) may lead to thickness variations based on the application or spreading means. Further, because photoresist layer 210 is formed on the non-planar surface of non-planar substrate 200, the thickness profile of photoresist layer 210 may not be constant in thickness in this incident direction. It is noted that the topography of the surface may cause non-uniformities in the photoresist thickness, even for spin coating and vapor deposition techniques.

This determination of the thickness profile of photoresist layer 210 in the direction incident to light 230 used for laser writing may be used to determine a grayscale scanning pattern 220, step 140. By measuring the thickness profile of photoresist layer 210, any deviation (anomalies) in this thickness may be compensated for by grayscale scanning pattern 220. That is, by changing the exposure pattern in photoresist layer 210 and either by exposing a portion of the photoresist layer at the deviation/anomaly for a longer duration/or with a higher power (for overly thick portions) or, otherwise, exposing photoresist layer 210 at the deviation/anomaly for a shorter duration or with a lower power (for overly thin portions), anomalies may be mitigated to produce the desired feature 270 in substrate 200. Grayscale scanning pattern 220 refers to an exposure mapping and the subsequent exposed of proportions of the surface of photoresist layer 210, which are desirably to be removed to form grayscale pattern 255 on photoresist layer 210.

More particularly, by determining the thickness profile of photoresist layer 210 and using predetermined information of desired feature 270 (for example, as shown in FIG. 7) to be etched into non-planar substrate 200, grayscale scanning pattern 220 may be calculated in step 130. The etching rate of the photoresist in photoresist layer 210 and the etching rate of the material of substrate 200 are desirably taken into account in determining grayscale scanning pattern 220. It is noted that the etching rate of the photoresist is often faster than the etching rate of the material. Thus, grayscale scanning pattern 220 may often have greater relief than the desired feature 270, which may allow for increased precision in the height of desired feature 270, but may impose a reduced maximum feature aspect ratio due to the aspect ratio that may be achieved in the photoresist without excessive undercutting.

The thickness profile of photoresist layer 210 may be determined by profiling non-planar substrate 200 prior to forming photoresist layer 210 (alternative step 110) and after forming photoresist layer 210. In this case, since the profiles are conducted separately, it is desirable to perform registration of these profiles as part of the thickness profiling. Although profiling photoresist layer 210 may be performed using any of the profilometry technique discussed above, a non-contact technique may be desirably, depending on the durability of the photoresist used. It may be desirable to use the same profilometry technique for both measurements.

One alternative may be to calculate the difference between the profiles prior to and after forming photoresist layer 210. A second alternative may be to estimate the thickness profile of photoresist layer 210 by profiling (i.e., measuring) photoresist layer 210 after photoresist layer 210 is formed and calculating the thickness profile of photoresist layer 210 based on this measured profile of photoresist layer 210 after formation and an estimated profile (i.e., based on predetermined milling parameters) of the surface of non-planar substrate 200. A third alternative may be to profile the boundary of photoresist layer 210 and non-planar substrate 200 and the exposed surface of photoresist layer 210 simultaneously, for example, by using white light interferometry or another optical profilometric technique (by selecting photoresist layer 210 such that it is substantially transmissive/transparent to at least one of the wavelengths of light used in the optical profilometric technique). By such simultaneous profiling, any difficulties with registration of the profiles may be eliminated.

By determining the profile of the surface of non-planar substrate 200, grayscale scanning pattern 220 may be adjusted to further compensate for abnormalities (e.g., changes with respect to an expected profile) of the non-planar substrate 200.

Grayscale scanning pattern 220 may be laser-written on photoresist layer 210, step 150, to expose a portion or portions of photoresist layer 210. Laser-writing refers to scanning a laser beam of a particular wavelength for which photoresist layer 210 is susceptible to being exposed in a scan pattern over the photoresist layer. For example, a laser beam with a wavelength in the visible light range may be scanned in either a raster scan pattern across or a circular fashion around the surface of photoresist layer 210, which is responsive to the visible wavelength of the laser beam, thereby, exposing the portion or portions of photoresist layer 210.

As shown in FIG. 4, laser light 230 from a laser source (not shown) is directed towards photoresist layer 210 via focusing member 240 (e.g., a lens) and incident on photoresist layer 210 to form a beam spot 250. By controlling a scan rate of beam spot 250, an intensity of beam spot 250 and/or a width of beam spot 250, grayscale scanning pattern 220 on photoresist layer 210 may be produced. The scan rate and beam width of beam spot 250 may be controlled by moving substrate 200 and/or focusing member 240, or be manipulating laser beam 230 using optics included within the laser source of the laser writer. The intensity of beam spot 250 may be controlled by controlling the output power of the laser source directly or with a variable optical attenuator (not shown), and/or by varying the width of beam spot 250.

Because the substrate 200 may be non-planar, the beam spot 250 may preferably be continuously focused or focused in a stepwise manner depending on the profile of non-planar substrate 200 and grayscale scanning pattern 220. Desirably, an autofocusing mechanism (not shown) may be included in the laser writing device to ensure that beam spot 250 may be continuously focused on the photoresist surface.

It may be desirable to focus and scan beam spot 250 on photoresist layer 210 by moving non-planar substrate 200 on a table (not shown) configured to move with up to six degrees of freedom, i.e., three translation directions (X, Y and Z directions) and three rotational directions (rotation in the X-Y plane, rotation in the X-Z plane and rotation in the Y-Z plane) to produce the desired grayscale pattern 255. It is contemplated, however, that either non-planar substrate 200 or focusing member 240 may be moved for focusing and/or scanning of the beam spot.

The surface of the substrate 200 and or desired feature 270 may be such that at step 150, laser writing of grayscale scanning pattern 220 includes scanning beam spot 250 of the laser writing device across or around at least one portion of the non-planar surface of substrate 200 while focusing or auto-focusing beam spot 250 and modulating an intensity of laser light 230 from the laser writing device according to grayscale scanning pattern 220.

The scanning of beam spot 250 across photoresist layer 210, the focusing of beam spot 250 and the modulating of the intensity of laser light 230 include adjusting the scan rate of the scanning of beam spot 250, adjusting a focus or autocorrecting a focus of beam spot 250 on the non-planar surface of substrate 200 and/or adjusting the intensity of laser light 230 from the laser writing device to provide a desired exposure level for each scan point in the determined grayscale scanning pattern 220.

Grayscale pattern 255 may be formed by removing the portion of photoresist layer 210 exposed by laser-writing of grayscale scanning pattern 220 on photoresist layer 210, step 160. That is, for example, by using a positive photoresist layer and developing the portion or portions of photoresist layer 210 that are exposed during the laser writing operation to remove these portions, grayscale pattern 255 may be formed in photoresist layer 210. Any number of other known developing techniques may be used to form grayscale pattern 255, including both dry etch and wet etch techniques. It is noted that wet etches are usually isotropic, thus, dry etching techniques may be desired for this application so that similar techniques may be used for developing photoresist layer 210 and for forming the desired feature on the substrate surface.

Photoresist layer 210 and the surface of non-planar substrate 200 are etched, step 170, using either a wet or dry etch technique to form desired feature 270. The etching technique is selected to etch both photoresist layer 210 and substrate 200, although the etching technique may etch these two material at different rates. This is different from most standard semiconductor device etching processes in which the etchant is chosen to etch only the exposed substrate and not the photoresist. It is desirable to use an anisotropic etching technique such as ion beam milling or reactive ion etching, among others to perform step 170. In either of these exemplary anisotropic etching technique, the ion, or etchant, being used is desirably able to etch both photoresist layer 210 and substrate 200. It is contemplated, however, that an isotropic, or semi-isotropic, etching technique may be used by compensating for such isotropic etching during the determination of the grayscale scan pattern 220 at step 140.

The exemplary method of FIG. 1 may also include an optional step (not shown) of the selection of an etchant, photoresist layer 210 and/or substrate 200 according to respective etching rates of the etchant on the photoresist of photoresist layer 210 and the material of substrate 200. This optional selection step may allow the etching of photoresist layer 210 may occur at a first etching rate and the etching of the surface of substrate 200 may occur at a second etching rate to form desired feature 270 in substrate 200 as a substantially scaled version of grayscale pattern 255 in photoresist layer 210 in the etching direction.

By selecting different etching rates for photoresist layer 210 and substrate 200, a scaled version of grayscale pattern 255 formed in the photoresist may be realized in substrate 200. That is, when the etching rate in photoresist layer 210 for a particular etchant is less than that of substrate 200, feature 270 is proportionally larger in the etching direction than that of grayscale pattern 255. Moreover, when the etching rate in photoresist layer 210 is greater than that of substrate 200, feature 270 is proportionally smaller in the etching direction than that of grayscale pattern 255. Thus, it may be preferable to adjust etching rates, for example, to produce precisely expanded or contracted features in substrate 200 from grayscale pattern 255. Moreover, improved controllability of the height of various features may allow smaller feature sizes to be achievable.

It is contemplated that this method may be used to produce any number of different features such as a plurality of concentric Fresnel grooves and/or a plurality of linear grooves, among others, on various materials such as tungsten, tungsten carbide, sapphire, plastics, ceramics, dielectrics, and/or metals including stainless steel and nickel, among others. Also, although substrate 200 is shown as non-planar in FIGS. 2-7, it is contemplated that substrate 200 may be a planar substrate.

Once desired feature 270 is produced in substrate 200, any portion of photoresist layer 210 remaining on substrate 200 may be removed by any number of known techniques. However, it is noted that the selected technique desirably should not substantially affect the material of substrate 200.

Figure 8A:
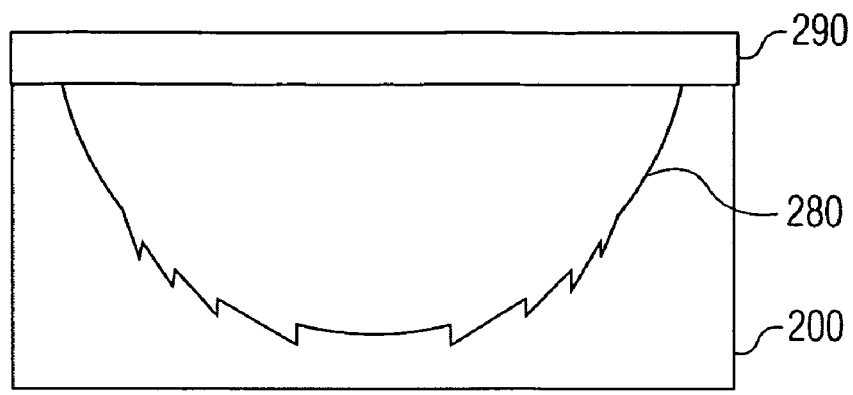
FIG. 8A is a cross-sectional side view illustrating an exemplary mold for producing a concave hybrid lens with converging diffractive sections that may be produced using the exemplary method of FIG. 1.

FIG. 8A is a cross-sectional side view illustrating a mold for producing a concave hybrid lens with converging diffractive sections that may be formed using the exemplary method of FIG. 1.

Figure 8B:
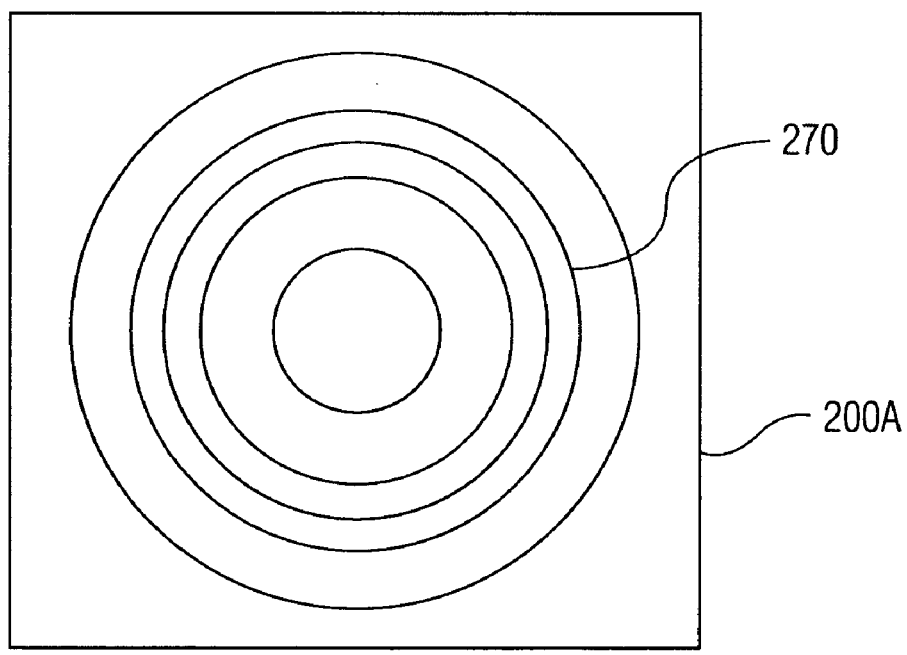
Figure 8C:
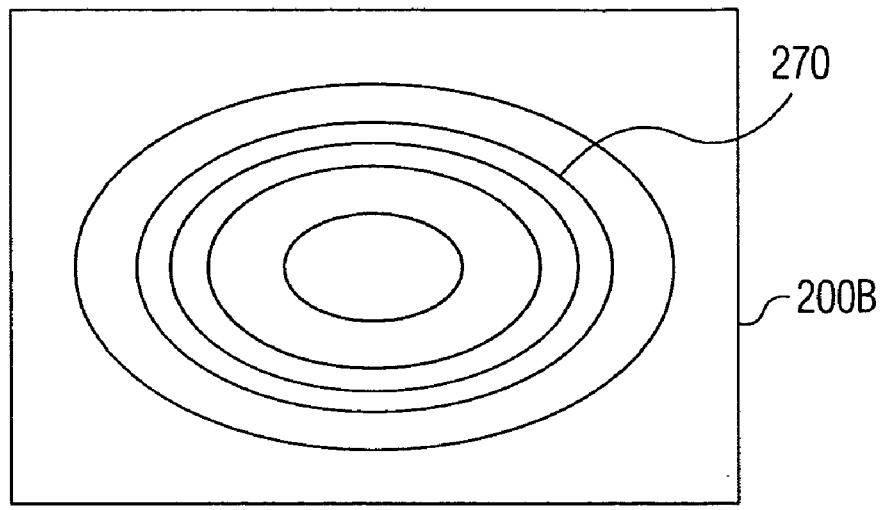
Figure 8D:
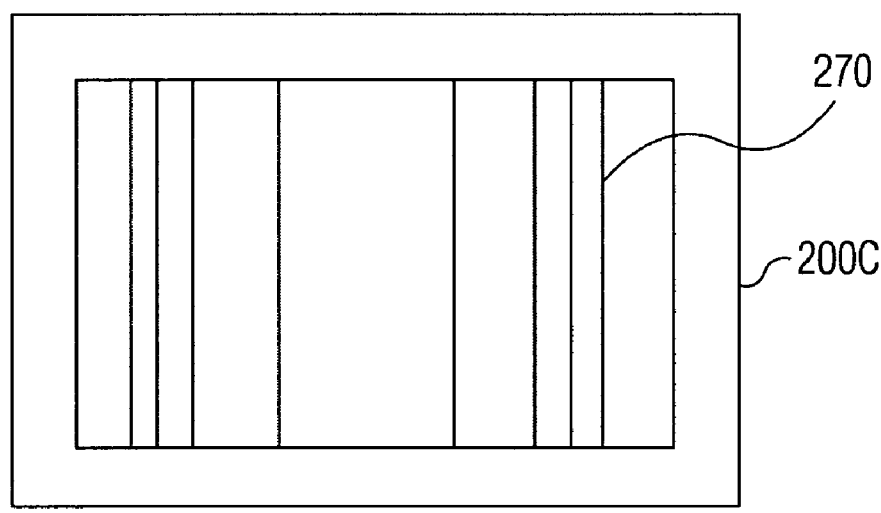

FIGS. 8B-8D are top plan views illustrating alternate exemplary embodiments of the feature in the substrate shown in FIG. 8A. FIG. 8B illustrates an exemplary mold base 200A which may be used to form a circular lens. FIG. 8C illustrates an exemplary mold base 200B which may be used to form an elliptical lens. FIG. 8D illustrates an exemplary mold base 200C which may be used to form a cylindrical lens.

Referring now to FIGS. 8A-8D, after desired feature 270 is formed in non-planar substrate 200, non-planar substrate 200 may be used as a first mold part for molding applications such as compression molding, extrusion molding, or injection molding, among others. A further optional step may include forming release layer 280 on at least a portion of the surface of substrate 200 to prevent adherence thereto by the material being molded. Release layer 280 may be formed, for example, by a vapor deposition process and may include a thin film metallization layer. For example, thin films including one or more of: platinum; palladium; iridium; nickel; tungsten; titanium; chromium; molybdenum; scandium; vanadium; or aluminum, among others, may be used to form release layer 280. When non-planar substrate 200 is used as a mold part, release layer 280 may both prevent adherent by a mold product by providing reduced adhesion to ease part release from the mold. It may also provide for improved corrosion resistances to protect non-planar substrate 200 during the molding process.

The exemplary mold of FIG. 8A includes second mold part 290. It is contemplated that the shape of second mold 290 may be flat, as shown in FIG. 8A, or may include a 3D pattern on its surface as well. In the case of a mold for an optical device, the mold product produced by the exemplary mold of FIG. 8A may be, for example, a hybrid lens with a Fresnel groove pattern or an optical grating thereon.

Figure 9:
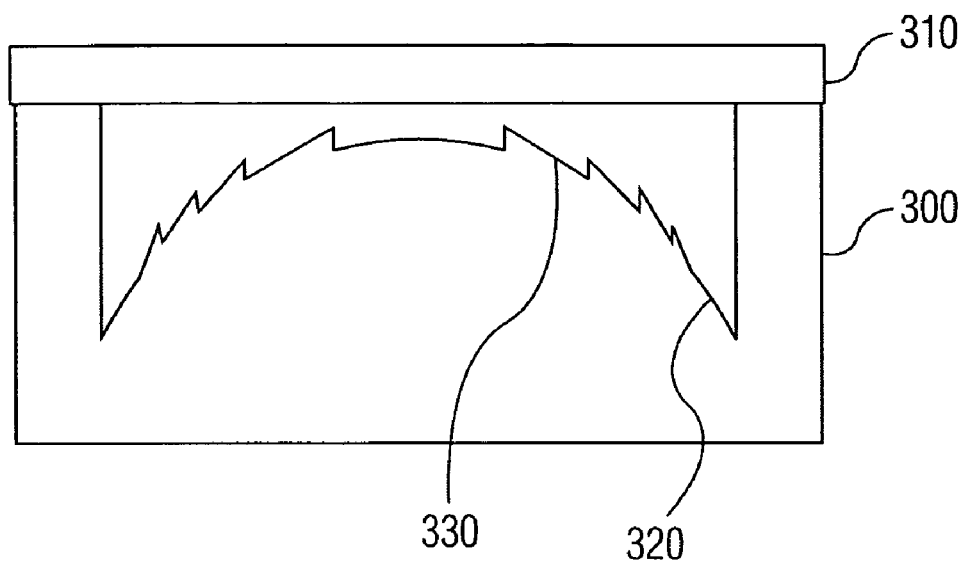
FIG. 9 is a cross-sectional side view illustrating another exemplary mold for producing a convex hybrid lens with diverging diffractive sections that may be produced using the exemplary method of FIG. 1.
Figure 10:
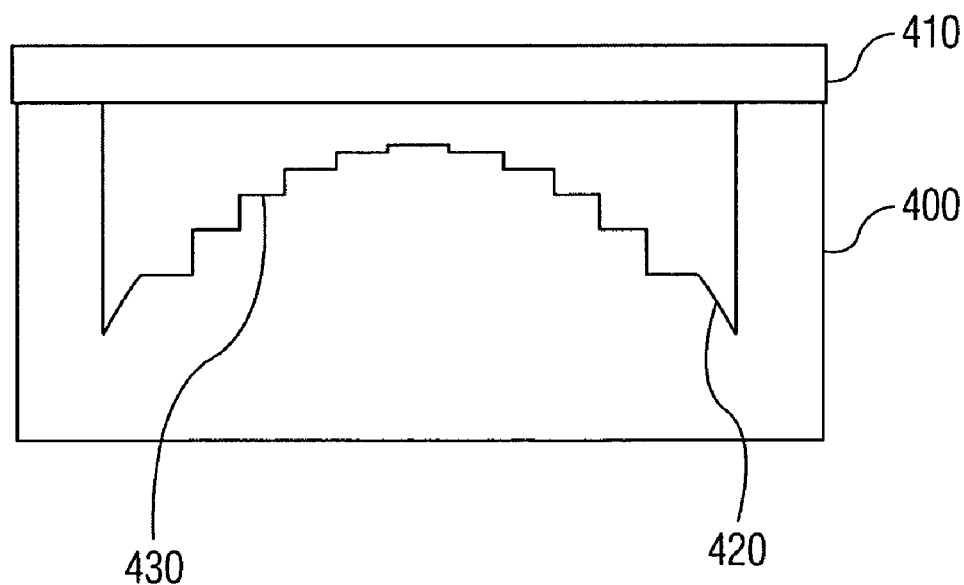
FIG. 10 is a cross-sectional side view illustrating a further exemplary mold for producing a convex hybrid lens with stair step diffractive sections that may be produced using the exemplary method of FIG. 1.
Figure 11:
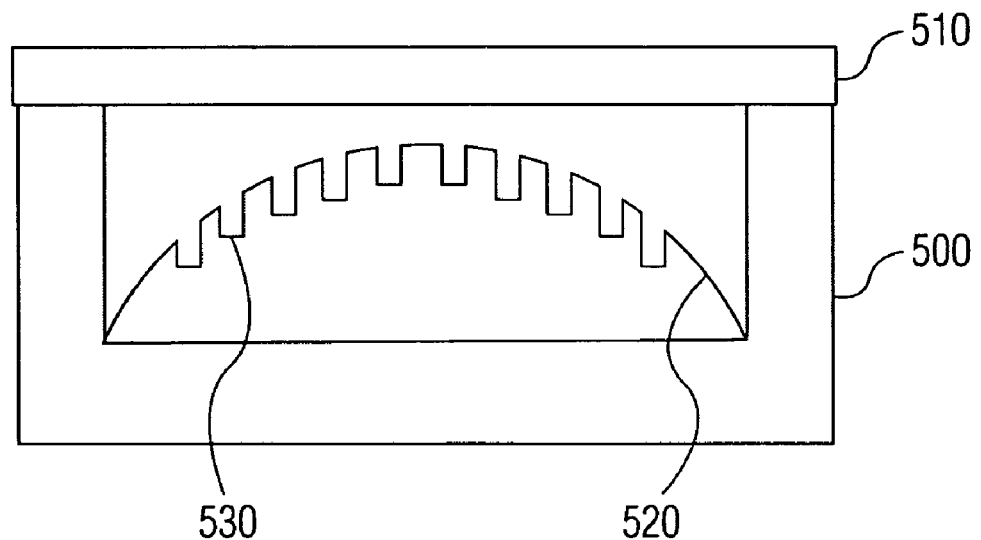
FIG. 11 is a cross-sectional side view illustrating an additional exemplary mold for producing a convex hybrid lens with diffractive grating sections that may be produced using the exemplary method of FIG. 1.
Figure 12:
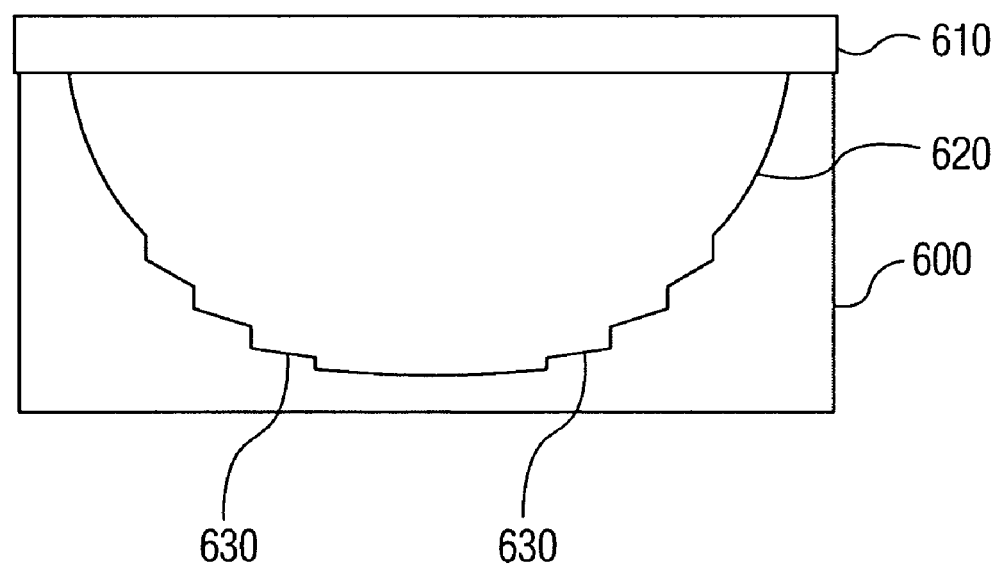
FIG. 12 is a cross-sectional side view illustrating yet another exemplary mold for producing a concave hybrid lens with diverging diffractive sections that may be produced using the exemplary method of FIG. 1.

FIGS. 9-11 are cross-sectional side views illustrating other exemplary molds for producing hybrid lens with diffractive sections which may be produced by the exemplary method of FIG. 1. In particular, FIG. 9 is a cross-sectional side view illustrating an exemplary mold for producing a convex hybrid lens with diverging diffractive sections, FIG. 10 is a cross-sectional side view illustrating an exemplary mold for producing a convex hybrid lens with stair step diffractive sections, FIG. 11 is a cross-sectional side view illustrating a mold for producing a convex hybrid lens with diffractive grating sections, and FIG. 12 is a cross-sectional side view illustrating a mold for producing a concave hybrid lens with diverging diffractive sections.

Referring now to FIG. 9, the exemplary mold includes a first mold part 300 that may be formed from a substrate using the exemplary method of FIG. 1 and a second mold part 310. First mold part 300 includes at least one grooved section 330 formed in a portion thereof and a concave section 320. For example, by compression molding, a mold product may be formed in a cavity formed between first and second mold parts 300 and 310. Grooved section 330 may form a variable width sawtooth pattern to produce a diverging diffractive section in the mold product.

Referring now to FIG. 10, the exemplary mold includes a first mold part 400 that is formed from a substrate using the exemplary method of FIG. 1 and a second mold part 410. First mold part 400 includes at least one stepped section 430 formed in a portion thereof and a concave section 420. For example, by compression molding, a mold product may be formed in a cavity formed between the first and second mold parts 400 and 410. Stepped section 430 may form a variable width step pattern to produce a stair step diffractive section in the mold product.

Referring now to FIG. 11, the exemplary mold includes a first mold part 500 that is formed from a substrate using the exemplary method of FIG. 1 and a second mold part 510. First mold part 500 includes a plurality of slots 530 formed in a portion thereof and a concave section 520. For example, by compression molding, a mold product may be formed in a cavity formed between the first and second mold parts 500 and 510. The plurality of slots may form a variable depth slot pattern to produce a diffractive grating section in the mold product.

Referring now to FIG. 12, the exemplary mold includes a first mold part 600 that is formed from a substrate using the exemplary method of FIG. 1 and a second mold part 610. First mold part 600 includes at least on sawtooth section 630 formed in a portion thereof and a convex section 620. For example, by compression molding, a mold product may be formed in a cavity formed between the first and second mold parts 600 and 610. The sawtooth section may form a variable width groove pattern to produce a diverging diffractive section in the mold product.

As is apparent from the exemplary optical molds illustrated in FIGS. 8A and 9-12, any number of other features (i.e., grayscale scan patterns) may be formed in a mold to produce a mold product using a method according to exemplary embodiments of the present invention. Alternatively, such features may be formed directly on a product using a method according to exemplary embodiments of the present invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A method of etching a feature in a non-planar surface of a substrate, comprising the steps of:
   a) forming a photoresist layer on the non-planar surface of the substrate;
   b) determining a grayscale scanning pattern based on the feature and the non-planar surface of the substrate, the grayscale scanning pattern including information for maintaining a focus of a beam spot on the photoresist layer throughout the grayscale scanning pattern;
   c) laser writing the grayscale scanning pattern determined in step (b) on the photoresist layer to expose a portion of the photoresist layer;
   d) removing the portion exposed in step (c) to form a grayscale pattern in the photoresist layer; and
   e) etching the photoresist layer and the non-planar surface of the substrate to form the feature.

2. The method according to claim 1, wherein step (d) includes the steps of:
   d1) scanning the beam spot across at least one portion of the non-planar surface of the substrate; and
   d2) focusing the beam spot and modulating a power of light in the beam spot according to the grayscale scanning pattern as the beam spot is scanned across the at least one portion of the non-planar surface of the substrate.

3. The method according to claim 1, wherein step (a) includes one of:
   depositing the photoresist layer on the non-planar surface of the substrate using vapor deposition;
   spreading the photoresist layer on the non-planar surface of the substrate;
   spin coating the photoresist layer on the non-planar surface of the substrate;
   dip coating the photoresist layer on the non-planar surface of the substrate; or
   film coating the photoresist layer on the non-planar surface of the substrate.

4. The method according to claim 1, wherein:
   the grayscale scanning pattern includes a plurality of scan points; and
   step (b) includes determining a scan rate of the beam spot incident on the photoresist layer for laser writing in step (c), a width of the beam spot, and an intensity of the beam spot for each scan point in the grayscale scanning pattern.

5. The method according to claim 1, wherein:
   the grayscale scanning pattern includes a plurality of scan points; and
   step (c) includes the step of adjusting the focus of the beam spot on the photoresist layer to produce a desired scan width for each scan point in the grayscale scanning pattern as the beam spot is scanned across the non-planar surface of the substrate.

6. The method according to claim 1, wherein step (c) includes the steps of:
   c1) scanning the beam spot of a laser writing device across at least one portion of the non-planar surface of the substrate; and
   c2) providing a desired exposure level according to the determined grayscale scanning pattern by at least one of:
      adjusting a scan rate of the scanning of the beam spot across the at least one portion of the non-planar surface of the substrate;
      adjusting the focus of the beam spot on the non-planar surface of the substrate; or
      adjusting a power of light from the laser writing device.

7. The method according to claim 1, wherein step (e) includes anisotropically etching the photoresist layer and the non-planar surface of the substrate.

8. The method according to claim 7, wherein step (e) further includes the steps of:
   e1) selecting at least one of an etchant, the photoresist layer, or the substrate such that etching of the photoresist layer with the etchant occurs at a first etching rate and etching of the non-planar surface of the substrate with the etchant occurs at a second etching rate; and
   e2) etching the photoresist layer and the non-planar surface of the substrate with the etchant to form the feature in the substrate, the feature being a substantially scaled version of the grayscale pattern in the photoresist layer in a direction of the etching.

9. The method according to claim 8, wherein the feature formed in the substrate is proportionally larger than the grayscale pattern formed in step (d) in the direction of the etching.

10. The method according to claim 8, wherein the feature formed in the substrate is proportionally smaller than the grayscale pattern formed in step (d) in the direction of the etching.

11. The method according to claim 1, wherein step (e) includes one of:
    dry etching the photoresist layer and the non-planar surface of the substrate;
    ion beam milling the photoresist layer and the non-planar surface of the substrate; or
    reactive ion etching the photoresist layer and the non-planar surface of the substrate.

12. The method according to claim 1, wherein:
    the substrate is one of a lens or a lens mold part; and
    step (e) includes forming, as the feature in the lens or the mold part, at least one of a plurality of concentric circular grooves; a plurality of concentric elliptical grooves, or a plurality of linear grooves.

13. A method of etching a feature in a surface of a substrate, comprising the steps of:
 a) forming a photoresist layer on the surface of the substrate;
 b) determining a thickness profile of the photoresist layer;
 c) determining a grayscale scanning pattern based on the feature and the thickness profile of the photoresist layer;
 d) laser writing the grayscale scanning pattern determined in step (c) on the photoresist layer to expose a portion of the photoresist layer;
 e) removing the portion exposed in step (d) to form a grayscale pattern in the photoresist layer; and
 f) etching the photoresist layer and the surface of the substrate to form the feature.

14. The method according to claim 13, wherein:
 step (b) further includes profiling the surface of the substrate; and
 step (c) includes determining of the grayscale scanning pattern further based on a profile of the surface of the substrate determined in step (b).

15. The method according to claim 14, wherein the determining of the grayscale scanning pattern in step (c) includes compensating for changes in depth of the photoresist layer and the surface of the substrate in an incidence direction of light used for laser writing in step (d).

16. The method according to claim 13, wherein step (b) includes the steps of:
 b1) profiling the surface of the substrate;
 b2) forming a photoresist layer on the surface of the substrate;
 b3) profiling a surface of the photoresist layer; and
 b4) calculating a thickness profile of the photoresist layer formed in step (b2) in an incidence direction of light for laser writing in step (d).

17. The method according to claim 13, wherein step (b) includes the steps of;
 b1) forming a photoresist layer on the surface of the substrate;
 b2) profiling the surface of the substrate and a surface of the photoresist layer simultaneously; and
 b3) calculating a thickness profile of the photoresist layer formed in step (b1) in an incidence direction of light for laser writing in step (d).

18. The method according to claim 13, wherein the determining of the grayscale scanning pattern in step (c) includes compensating for changes in depth of the photoresist layer in a direction incident to light used for laser writing in step (d).

19. A method of etching a feature in a non-planar mold surface of a mold part, comprising the steps of:
 a) providing the mold part;
 b) forming a photoresist layer on the non-planar mold surface of the mold part;
 c) determining a grayscale scanning pattern based on the feature and the non-planar mold surface of the mold part, the grayscale scanning pattern including information for maintaining a focus of a beam spot on the photoresist layer throughout the grayscale scanning pattern;
 d) laser writing the grayscale scanning pattern determined in step (b) on the photoresist layer to expose a portion of the photoresist layer;
 e) removing the portion exposed in step (c) to form a grayscale pattern in the photoresist layer;
 f) etching the photoresist layer and the non-planar mold surface of the mold part to form the feature; and
 g) forming a release layer on at least a portion of the non-planar mold surface of the mold part to reduce adherence by a mold product to the mold part during molding.

20. The method according to claim 19, wherein release layer includes at least one of platinum; palladium iridium; nickel; tungsten; titanium; chromium; molybdenum; scandium; vanadium; or aluminum.

* * * * *

UNITED STATES PATENT AND TRADEMARK OFFICE
CERTIFICATE OF CORRECTION

PATENT NO. : 7,265,057 B2
APPLICATION NO. : 11/282884
DATED : September 4, 2007
INVENTOR(S) : Xinbing Liu It is certified that error appears in the above-identified patent and that said Letters Patent is hereby corrected as shown below:

Col 20, line 2 "palladium iridium;" should read --palladium; iridium;--

Signed and Sealed this

Nineteenth Day of August, 2008

JON W. DUDAS
*Director of the United States Patent and Trademark Office*